(12) United States Patent
Xue et al.

(10) Patent No.: US 11,393,523 B1
(45) Date of Patent: Jul. 19, 2022

(54) MEMORY UNIT WITH ASYMMETRIC GROUP-MODULATED INPUT SCHEME AND CURRENT-TO-VOLTAGE SIGNAL STACKING SCHEME FOR NON-VOLATILE COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Cheng-Xin Xue, Hsinchu (TW);
Hui-Yao Kao, Hsinchu (TW);
Sheng-Po Huang, Hsinchu (TW);
Yen-Hsiang Huang, Hsinchu (TW);
Meng-Fan Chang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 17/148,504

(22) Filed: Jan. 13, 2021

(51) Int. Cl.
| | |
|---|---|
| *G11C 7/22* | (2006.01) |
| *G11C 11/4094* | (2006.01) |
| *G11C 11/408* | (2006.01) |
| *G11C 5/06* | (2006.01) |
| *G11C 11/4074* | (2006.01) |
| *G11C 13/00* | (2006.01) |
| *G11C 27/00* | (2006.01) |
| *G11C 11/54* | (2006.01) |

(52) U.S. Cl.
CPC ............ *G11C 11/4094* (2013.01); *G11C 5/06* (2013.01); *G11C 11/4074* (2013.01); *G11C 11/4085* (2013.01); *G11C 11/54* (2013.01); *G11C 13/0002* (2013.01); *G11C 13/0021* (2013.01); *G11C 13/0069* (2013.01); *G11C 27/00* (2013.01)

(58) Field of Classification Search
CPC ............ G11C 13/0002; G11C 13/0021; G11C 13/0069; G11C 27/00; G11C 15/046; G11C 2213/79; H03K 19/1737
See application file for complete search history.

(56) References Cited

U.S. PATENT DOCUMENTS

| 10,073,733 B1* | 9/2018 | Jain | G06F 11/108 |
| 10,381,071 B1* | 8/2019 | Si | G11C 7/062 |
| 2008/0310236 A1* | 12/2008 | Baker | G11C 11/5642 |
| | | | 365/158 |

(Continued)

*Primary Examiner* — Mushfique Siddique
(74) *Attorney, Agent, or Firm* — CKC & Partners Co., LLC

(57) ABSTRACT

A memory unit with an asymmetric group-modulated input scheme and a current-to-voltage signal stacking scheme for a plurality of non-volatile computing-in-memory applications is configured to compute a plurality of multi-bit input signals and a plurality of weights. A controller splits the multi-bit input signals into a plurality of input sub-groups and generates a plurality of switching signals according to the input sub-groups, and the input sub-groups are sequentially inputted to the word lines. The current-to-voltage signal stacking converter converts the bit-line current from a plurality of non-volatile memory cells into a plurality of converted voltages according to the input sub-groups and the switching signals, and the current-to-voltage signal stacking converter stacks the converted voltages to form an output voltage. The output voltage is corresponding to a sum of a plurality of multiplication values which are equal to the multi-bit input signals multiplied by the weights.

19 Claims, 13 Drawing Sheets

(56) References Cited

U.S. PATENT DOCUMENTS

| | | | |
|---|---|---|---|
| 2019/0102358 A1* | 4/2019 | Asnaashari | G11C 8/14 |
| 2020/0266822 A1* | 8/2020 | Tsuji | H01L 21/8239 |
| 2020/0372330 A1* | 11/2020 | Chang | H01L 27/2463 |
| 2020/0411066 A1* | 12/2020 | Choi | G11C 11/1659 |
| 2021/0247962 A1* | 8/2021 | Chang | G11C 13/0026 |
| 2021/0294874 A1* | 9/2021 | Tang | G11C 7/16 |
| 2021/0375353 A1* | 12/2021 | Liu | G11C 11/4085 |

\* cited by examiner

US 11,393,523 B1

MEMORY UNIT WITH ASYMMETRIC GROUP-MODULATED INPUT SCHEME AND CURRENT-TO-VOLTAGE SIGNAL STACKING SCHEME FOR NON-VOLATILE COMPUTING-IN-MEMORY APPLICATIONS AND COMPUTING METHOD THEREOF

BACKGROUND

Technical Field

The present disclosure relates to a memory unit for a plurality of non-volatile computing-in-memory applications and a computing method thereof. More particularly, the present disclosure relates to a memory unit with an asymmetric group-modulated input scheme and a current-to-voltage signal stacking scheme for a plurality of non-volatile computing-in-memory applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiply-and-accumulate (MAC) operations for artificial intelligence (AI) chips, and multiple-bit convolutional neural network (CNN) is required for high inference accuracy in many applications.

For example, battery-powered tiny AI edge devices require high precision of MAC computing for non-volatile computing-in-memory (nvCIM) to support complex applications. However, achieving high precision involves various challenges. First, long input latency caused by conventional input schemes. Second, limited system-level inference accuracy due to small signal margin. Third, high power consumption in readout circuit due to large amount of DC current.

The memory unit with the conventional fully-decoded wordline pulse-count input scheme and the memory unit with the conventional fully-decoded wordline pulse-width input scheme suffer long latency due to a lower number of parallel inputs that need multiple cycles for applying inputs to nvCIM and corresponding computing operations. Therefore, a memory unit with an asymmetric group-modulated input (AGMI) scheme and a current-to-voltage signal stacking (CVSS) scheme for a plurality of nvCIM applications and a computing method thereof having the features of reducing the computing latency, achieving larger signal margin and decreasing the energy consumption are commercially desirable.

SUMMARY

According to one aspect of the present disclosure, a memory unit with an asymmetric group-modulated input (AGMI) scheme and a current-to-voltage signal stacking (CVSS) scheme for a plurality of non-volatile computing-in-memory (nvCIM) applications is configured to compute a plurality of multi-bit input signals and a plurality of weights. The memory unit with the AGMI scheme and the CVSS scheme for the nvCIM applications includes a plurality of non-volatile memory cells, a source line, a bit line, a controller and a CVSS converter. The non-volatile memory cells are controlled by a plurality of word lines to generate a plurality of memory cell currents and storing the weights. The word lines transmit the multi-bit input signals, respectively. The source line is electrically connected to one end of each of the non-volatile memory cells. The bit line is electrically connected to another end of each of the non-volatile memory cells and has a bit-line current. The bit-line current is equal to a sum of the memory cell currents. The controller is electrically connected to the non-volatile memory cells. The controller splits the multi-bit input signals into a plurality of input sub-groups and generates a plurality of switching signals according to the input sub-groups, and the input sub-groups are sequentially inputted to the word lines. The CVSS converter is electrically connected to the non-volatile memory cells via the bit line. The CVSS converter is electrically connected to the controller and converts the bit-line current into a plurality of converted voltages according to the input sub-groups and the switching signals, and the CVSS converter stacks the converted voltages to form an output voltage, and the output voltage is corresponding to a sum of a plurality of multiplication values which are equal to the multi-bit input signals multiplied by the weights.

According to another aspect of the present disclosure, a computing method of the memory unit with the AGMI scheme and the CVSS scheme for the nvCIM applications includes performing a voltage level applying step and a computing step. The voltage level applying step includes applying a plurality of voltage levels to the multi-bit input signals and the switching signals. The computing step includes driving the controller to split the multi-bit input signals into the input sub-groups, and driving the controller to sequentially input the input sub-groups to the word lines, and driving the CVSS converter to convert the bit-line current into a plurality of converted voltages according to the input sub-groups and the switching signals, and driving the CVSS converter to stack the converted voltages to form an output voltage. The output voltage is corresponding to a sum of a plurality of multiplication values which are equal to the multi-bit input signals multiplied by the weights.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
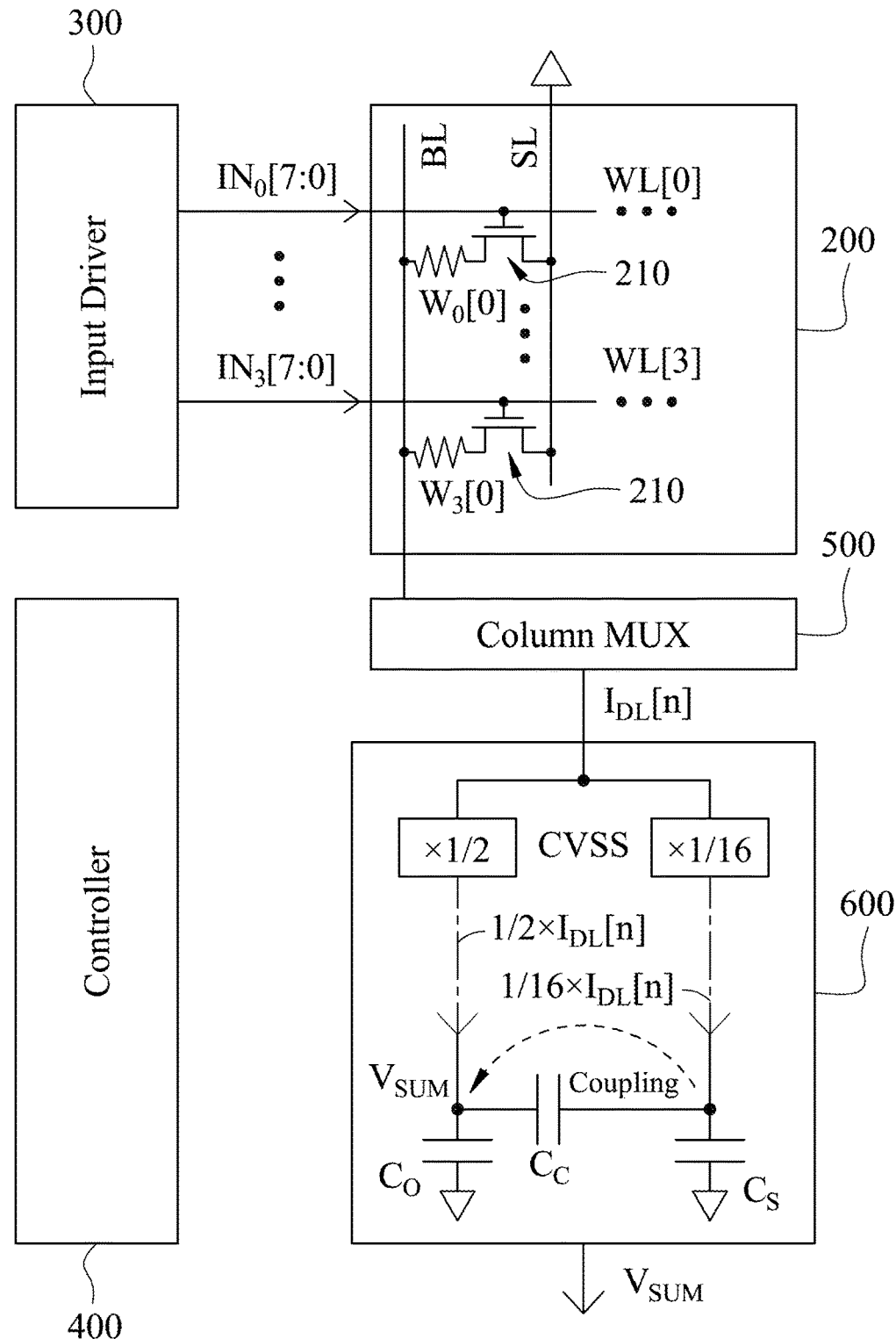
FIG. 1 shows a block diagram of a memory unit with an asymmetric group-modulated input (AGMI) scheme and a current-to-voltage signal stacking (CVSS) scheme for a plurality of non-volatile computing-in-memory (nvCIM) applications according to one embodiment of the present disclosure.
Figure 2:
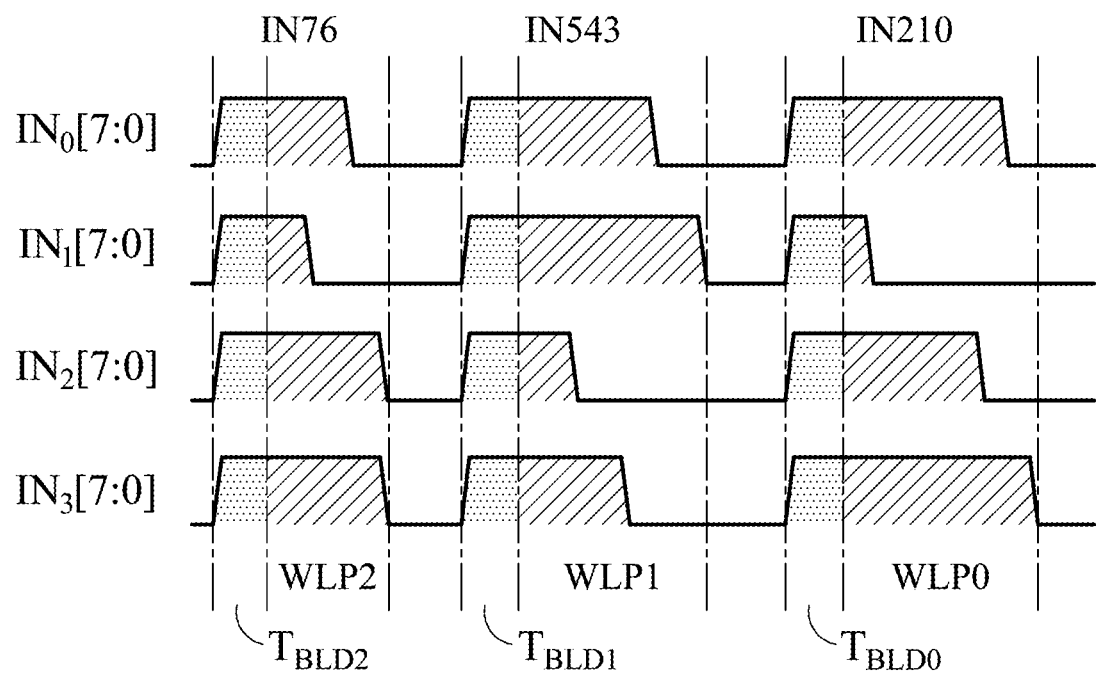
FIG. 2 shows a schematic view of the AGMI scheme of the memory unit of FIG. 1.
Figure 3:
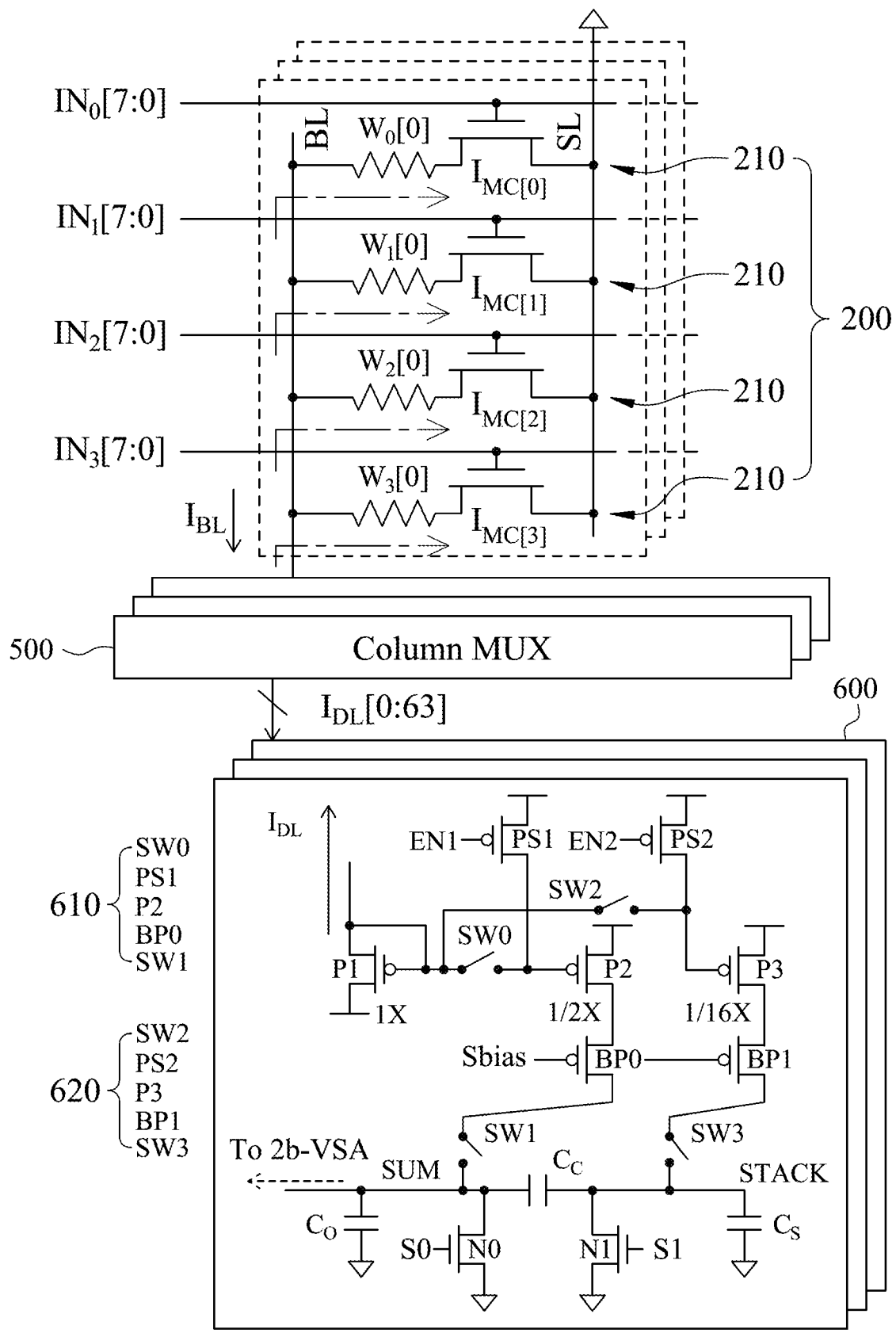
FIG. 3 shows a circuit diagram of a non-volatile memory array, a column multiplexer and a CVSS converter of the memory unit of FIG. 1.

FIG. 1 shows a block diagram of a memory unit 100 with an asymmetric group-modulated input (AGMI) scheme and a current-to-voltage signal stacking (CVSS) scheme for a plurality of non-volatile computing-in-memory (nvCIM) applications according to one embodiment of the present disclosure. FIG. 2 shows a schematic view of the AGMI scheme of the memory unit 100 of FIG. 1. FIG. 3 shows a circuit diagram of a non-volatile memory array 200, a column multiplexer 500 and a CVSS converter 600 of the memory unit 100 of FIG. 1. The memory unit 100 with the AGMI scheme and the CVSS scheme for the nvCIM applications is configured to compute a plurality of multi-bit input signals (e.g., $IN_0[7:0]$, $IN_1[7:0]$, $IN_2[7:0]$, $IN_3[7:0]$) and a plurality of weights (e.g., $W_0[0]$, $W_1[0]$, $W_2[0]$, $W_3[0]$). The AGMI scheme represents that each of four 8-bit input signals $IN_0[7:0]$-$IN_3[7:0]$ may be split into three input sub-groups IN76, IN543, IN210 (2 bit-3 bit-3 bit) with three corresponding input phases WLP2, WLP1, WLP0 by a controller 400. The CVSS scheme represents that the bit-line current $I_{BL}$ may be converted into a plurality of converted voltages according to the input sub-groups IN76, IN543, IN210 and a plurality of switching signals (e.g., SWS0, SWS1, SWS2, SWS3, EN1, EN2, S0, S1), and the converted voltages are stacked to form an output voltage $V_{SUM}$ by the CVSS converter 600. In FIGS. 1-3, the memory unit 100 with the AGMI scheme and the CVSS scheme for the nvCIM applications includes the non-volatile memory array 200, a word line driver 300, a controller 400, a column multiplexer 500 and a CVSS converter 600.

The non-volatile memory array 200 includes a plurality of non-volatile memory cells 210, a source line SL and a bit line BL. The non-volatile memory cells 210 are controlled by a plurality of word lines WL[0], WL[1], WL[2], WL[3] to generate a plurality of memory cell currents $I_{MC[0]}$, $I_{MC[1]}$, $I_{MC[2]}$, $I_{MC[3]}$ and stores the weights $W_0[0]$-$W_3[0]$. The word lines WL[0]-WL[3] transmit the multi-bit input signals $IN_0[7:0]$-$IN_3[7:0]$, respectively. The source line SL is electrically connected to one end of each of the non-volatile memory cells 210. The bit line BL is electrically connected to another end of each of the non-volatile memory cells 210 and has a bit-line current $I_{BL}$. The bit-line current $I_{BL}$ is equal to a sum of the memory cell currents $I_{MC[0]}$-$I_{MC[3]}$. Each of the non-volatile memory cells 210 includes a resistive element and a transistor. The resistive element is electrically connected to the bit line BL and stores one of the weights $W_0[0]$-$W_3[0]$. The transistor is electrically connected between the resistive element and the source line SL. The source line SL is coupled to the ground voltage. The resistive element is in one of a high resistance state (HRS) and a low resistance state (LRS). The transistor is the NMOS transistor. In one embodiment, each of the non-volatile memory cells 210 may be a 1-transistor 1-resistor (1T1R) ReRAM cell.

The word line driver 300 is connected to the non-volatile memory cells 210 via the word lines WL[0]-WL[3]. The word line driver 300 is represented by "Input Driver" and is located on a left side of the non-volatile memory cells 210. The word line driver 300 generates the voltage levels of the multi-bit input signals $IN_0[7:0]$-$IN_3[7:0]$ to control each of the non-volatile memory cells 210 via the word lines WL[0]-WL[3].

The controller 400 is electrically connected to the non-volatile memory cells 210. The controller 400 is represented by "Controller" and is located on a bottom side of the word line driver 300. The controller 400 splits the multi-bit input signals $IN_0[7:0]$-$IN_3[7:0]$ into the input sub-groups IN76, IN543, IN210 and generates a plurality of switching signals (e.g., SWS0-SWS3, EN1, EN2, S0, S1) according to the input sub-groups IN76, IN543, IN210, and the input sub-groups IN76, IN543, IN210 are sequentially inputted to the word lines WL[0]-WL[3]. In other words, the controller 400 is configured to perform the AGMI scheme.

The column multiplexer 500 is electrically connected between each of the non-volatile memory cells 210 and the CVSS converter 600. The column multiplexer 500 is represented by "Column MUX" and is located on a bottom side of the non-volatile memory cells 210. The column multiplexer 500 receives the bit-line current $I_{BL}$ and generates a dataline current $I_{DL}[n]$ according to the bit-line current $I_{BL}$. n represents an integer value, such as 0-63.

The CVSS converter 600 is electrically connected to the non-volatile memory cells 210 via the bit line BL. The CVSS converter 600 is represented by "CVSS" and is located on a bottom side of the column multiplexer 500. The CVSS converter 600 is electrically connected to the controller 400 and converts the bit-line current $I_{BL}$ into the converted voltages according to the input sub-groups IN76, IN543, IN210 and the switching signals (e.g., SWS0-SWS3, EN1, EN2, S0, S1). The CVSS converter 600 stacks the converted voltages to form the output voltage $V_{SUM}$, and the output voltage $V_{SUM}$ is corresponding to a sum of a plurality of multiplication values which are equal to the multi-bit input signals $IN_0[7:0]$-$IN_3[7:0]$ multiplied by the weights $W_0[0]$-$W_3[0]$. In detail, the CVSS converter 600 receives the dataline current $I_{DL}[n]$ corresponding to the bit-line current $I_{BL}$ from the column multiplexer 500 and converts the dataline current $I_{DL}[n]$ into the converted voltages according to the input sub-groups IN76, IN543, IN210 and the switching signals (e.g., SWS0-SWS3, EN1, EN2, S0, S1). The CVSS converter 600 is configured to perform the CVSS scheme and includes a first dataline transistor P1, a first sub-converter 610, a second sub-converter 620, a coupling capacitor $C_C$, an output capacitor $C_O$, a stacking capacitor $C_S$, a first stacking transistor N0 and a second stacking transistor N1. The first dataline transistor P1 is electrically connected to the column multiplexer 500. The dataline current $I_{DL}[n]$ flows through the first dataline transistor P1. The first sub-converter 610 and the second sub-converter 620 are electrically connected to the first dataline transistor P1. One end (i.e., a node SUM) of the coupling capacitor $C_C$ is electrically connected to the first sub-converter 610. The output capacitor $C_O$ is electrically connected between the one end of the coupling capacitor $C_C$ and the ground voltage. The output capacitor $C_O$ is electrically connected to a 2-bit voltage sense amplifier 2b-VSA for sensing. A voltage difference across the output capacitor $C_O$ is equal to the output voltage $V_{SUM}$. The stacking capacitor $C_S$ is electrically connected between another end (i.e., a node STACK) of the coupling capacitor $C_C$ and the ground voltage. The first stacking transistor N0 is electrically connected between the one end of the coupling capacitor $C_C$ and the ground voltage. The second stacking transistor N1 is electrically connected between the another end of the coupling capacitor $C_C$ and the ground voltage. The first dataline transistor P1 is the PMOS transistor. Each of the first stacking transistor N0 and the second stacking transistor N1 is the NMOS transistor.

The first sub-converter 610 includes a first two-terminal switching element SW0, a first switching transistor PS1, a second dataline transistor P2, a first bias transistor BP0 and a second two-terminal switching element SW1. The first two-terminal switching element SW0 is electrically connected to the first dataline transistor P1. The first switching transistor PS1 is electrically connected between the first two-terminal switching element SW0 and the power supply voltage. The second dataline transistor P2 is electrically connected to the first two-terminal switching element SW0 and the first switching transistor PS1. The first bias transistor BP0 is electrically connected to the second dataline transistor P2. The second two-terminal switching element SW1 is electrically connected to the first bias transistor BP0, the coupling capacitor $C_C$, the output capacitor $C_O$ and the first stacking transistor N0. The first dataline transistor P1 has a first transistor width, and the second dataline transistor P2 has a second transistor width. The second transistor width is equal to one-half of the first transistor width, so that a current flowed through the second dataline transistor P2 may be equal to one-half of the dataline current $I_{DL}[n]$. Each of the first switching transistor PS1, the second dataline transistor P2 and the first bias transistor BP0 is the PMOS transistor.

The second sub-converter 620 is electrically connected between the first dataline transistor P1 and the another end of the coupling capacitor $C_C$. The first sub-converter 610 and the second sub-converter 620 are operated at different time periods. The second sub-converter 620 includes a third two-terminal switching element SW2, a second switching transistor PS2, a third dataline transistor P3, a second bias transistor BP1 and a fourth two-terminal switching element SW3. The third two-terminal switching element SW2 is electrically connected to the first dataline transistor P1. The second switching transistor PS2 is electrically connected between the third two-terminal switching element SW2 and the power supply voltage. The third dataline transistor P3 is electrically connected to the third two-terminal switching element SW2 and the second switching transistor PS2. The second bias transistor BP1 is electrically connected to the third dataline transistor P3. The fourth two-terminal switching element SW3 is electrically connected to the second bias transistor BP1, the coupling capacitor $C_C$, the stacking capacitor $C_S$ and the second stacking transistor N1. The third dataline transistor P3 has a third transistor width, and the third transistor width is equal to one-sixteenth of the first transistor width, so that a current flowed through the third dataline transistor P3 may be equal to one-sixteenth of the dataline current $I_{DL}[n]$. Each of the second switching transistor PS2, the third dataline transistor P3 and the second bias transistor BP1 is the PMOS transistor.

The CVSS converter 600 is controlled by the switching signals. The switching signals include a first switching signal SWS0, a second switching signal SWS1, a third switching signal SWS2, a fourth switching signal SWS3, a first enable signal EN1, a second enable signal EN2, a bias signal Sbias, a first stacking signal S0 and a second stacking signal S1. The first switching signal SWS0 is electrically connected to the first two-terminal switching element SW0 to switch the first two-terminal switching element SW0. The second switching signal SWS1 is electrically connected to the second two-terminal switching element SW1 to switch the second two-terminal switching element SW1. The third switching signal SWS2 is electrically connected to the third two-terminal switching element SW2 to switch the third two-terminal switching element SW2. The fourth switching signal SWS3 is electrically connected to the fourth two-terminal switching element SW3 to switch the fourth two-terminal switching element SW3. The first enable signal EN1 is electrically connected to the first switching transistor PS1 to switch the first switching transistor PS1. The first enable signal EN1 is equal to the first switching signal SWS0. The second enable signal EN2 is electrically connected to the second switching transistor PS2 to switch the second switching transistor PS2. The second enable signal EN2 is equal to the third switching signal SWS2. The bias signal Sbias is electrically connected to the first bias transistor BP0 and the second bias transistor BP1 to control the first bias transistor BP0 and the second bias transistor BP1. The first stacking signal S0 is electrically connected to the first stacking transistor N0 to control the first stacking transistor N0. The second stacking signal S1 is electrically connected to the second stacking transistor N1 to control the second stacking transistor N1.

In FIG. 2, the AGMI scheme of the memory unit 100 is operated in three bit line developing time intervals $T_{BLD2}$, $T_{BLD1}$, $T_{BLD0}$ and three computing time intervals of the three input phases (e.g., WLP2, WLP1, WLP0). The three input phases include a first input phase WLP2, a second input phase WLP1 and a third input phase WLP0. The computing time interval of the first input phase WLP2 follows the bit line developing time intervals $T_{BLD2}$. The computing time interval of the second input phase WLP1 follows the bit line developing time intervals $T_{BLD1}$. The computing time interval of the third input phase WLP0 follows the bit line developing time intervals $T_{BLD0}$. Each of the multi-bit input signals $IN_0[7:0]$-$IN_3[7:0]$ has eight bits. The input sub-groups IN76, IN543, IN210 include a first input sub-group IN76, a second input sub-group IN543 and a third input sub-group IN210, and the first input sub-group IN76, the second input sub-group IN543 and the third input sub-group IN210 have two bits, three bits and three bits, respectively. Therefore, the memory unit 100 with the AGMI scheme and the CVSS scheme for the nvCIM applications of the present disclosure not only utilizes the AGMI scheme to reduce the computing latency, decrease the array energy consumption and achieve larger signal margin of most significant bit part (MSB part, MSP), but also utilizes the CVSS scheme to decrease the energy consumption of place value computing, a sense amplifier and a reference generator.

Figure 4:
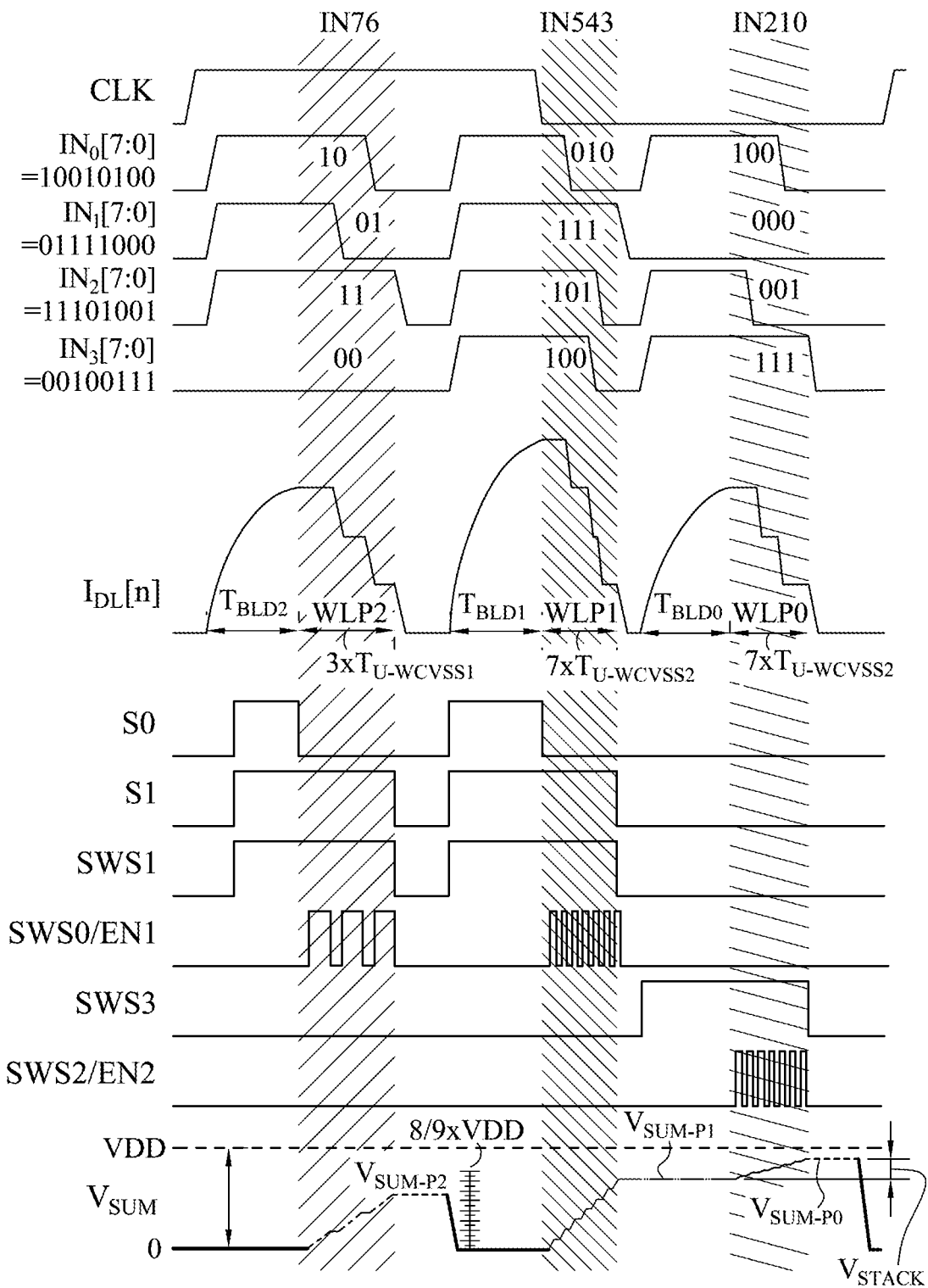
FIG. 4 shows timing diagrams of voltage levels of a plurality of 8-bit input signals, a plurality of switching signals and an output voltage and a current level of a dataline current, in accordance with an example of the 8-bit input signals of the present disclosure.

FIG. 4 shows timing diagrams of voltage levels of a plurality of 8-bit input signals $IN_0[7:0]$-$IN_3[7:0]$, a plurality of switching signals (e.g., SWS0-SWS3, EN1, EN2, S0, S1) and an output voltage $V_{SUM}$ and a current level of a dataline current $I_{DL}[n]$, in accordance with an example of the 8-bit input signals $IN_0[7:0]$-$IN_3[7:0]$ of the present disclosure. In FIG. 4, the 8-bit input signals $IN_0[7:0]$-$IN_3[7:0]$ are "10010100", "01111000", "11101001", "00100111", respectively. In the 8-bit input signal $IN_0[7:0]$, the first input sub-group IN76, the second input sub-group IN543 and the third input sub-group IN210 are "10", "010" and "100", respectively. In the 8-bit input signal $IN_1[7:0]$, the first input sub-group IN76, the second input sub-group IN543 and the third input sub-group IN210 are "01", "111" and "000", respectively. In the 8-bit input signal $IN_2[7:0]$, the first input sub-group IN76, the second input sub-group IN543 and the third input sub-group IN210 are "11", "101" and "001", respectively. In the 8-bit input signal $IN_3[7:0]$, the first input sub-group IN76, the second input sub-group IN543 and the third input sub-group IN210 are "00", "100" and "111", respectively. The input sub-groups IN76, IN543, IN210 are sequentially inputted to the word lines WL[0]-WL[3]. It is assumed that the resistive element of each of the non-volatile memory cells 210 is in LRS. The memory cell currents $I_{MC[0]}$, $I_{MC[1]}$, $I_{MC[2]}$, $I_{MC[3]}$ may be generated according to a state of the resistive element of each of the non-volatile memory cells 210 and the multi-bit input signals $IN_0[7:0]$-$IN_3[7:0]$, as shown in FIG. 3. The dataline current $I_{DL}[n]$ corresponding to the bit-line current $I_{BL}$ may be generated according to the memory cell currents $I_{MC[0]}$, $I_{MC[1]}$, $I_{MC[2]}$, $I_{MC[3]}$. During the first input phase WLP2, there are three computing sub-time intervals (i.e., $3 \times T_{U\text{-}WCVSS1}$) for sampling according to the first input sub-group IN76 of each of the multi-bit input signals $IN_0[7:0]$-$IN_3[7:0]$. During the second input phase WLP1, there are seven computing sub-time intervals (i.e., $7 \times T_{U\text{-}WCVSS2}$) for sampling according to the second input sub-group IN543 of each of the multi-bit input signals $IN_0[7:0]$-$IN_3[7:0]$. During the third input phase WLP0, there are seven computing sub-time intervals (i.e., $7 \times T_{U\text{-}WCVSS2}$) for sampling according to the second input sub-group IN210 of each of the multi-bit input signals $IN_0[7:0]$-$IN_3[7:0]$.

Figure 5:
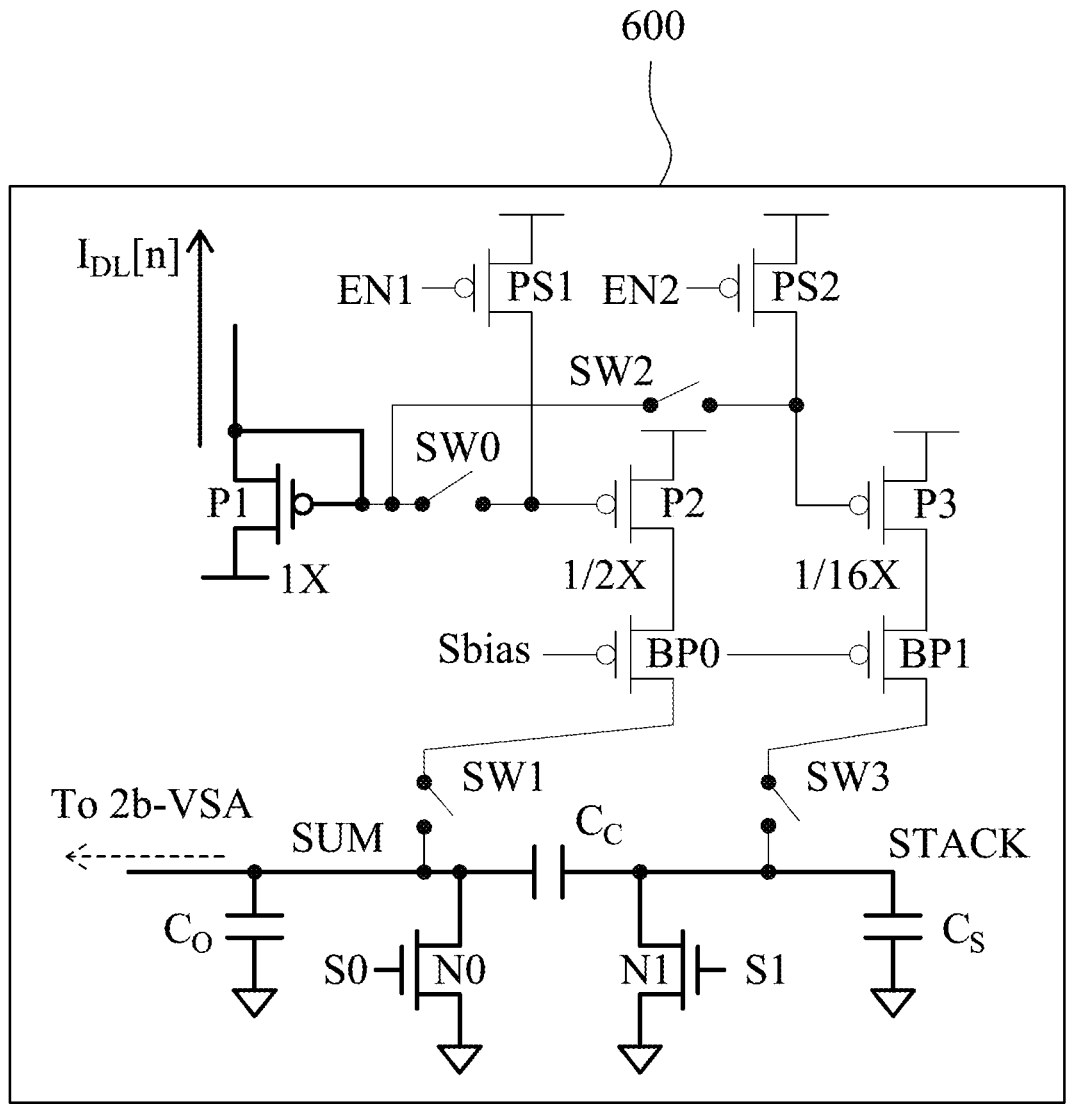
FIG. 5 shows a circuit diagram of each of a plurality of initial operations of the CVSS converter of the memory unit during each of a plurality of bit line developing time intervals of FIG. 4.

FIG. 5 shows a circuit diagram of each of a plurality of initial operations of the CVSS converter 600 of the memory unit 100 during each of a plurality of bit line developing time intervals $T_{BLD2}$, $T_{BLD1}$ of FIG. 4. In FIGS. 4 and 5, the dataline current $I_{DL}[n]$ flows through the first dataline transistor P1. The first sub-converter 610 and the second sub-converter 620 are turned off by setting the first switching signal SWS0 and the third switching signal SWS2 to 0. The first stacking transistor N0 and the second stacking transistor N1 are turned on by setting the first stacking signal S0 and the second stacking signal S1 to 1. The output voltage $V_{SUM}$ is equal to the ground voltage during each of the bit line developing time intervals $T_{BLD2}$, $T_{BLD1}$.

Figure 6:
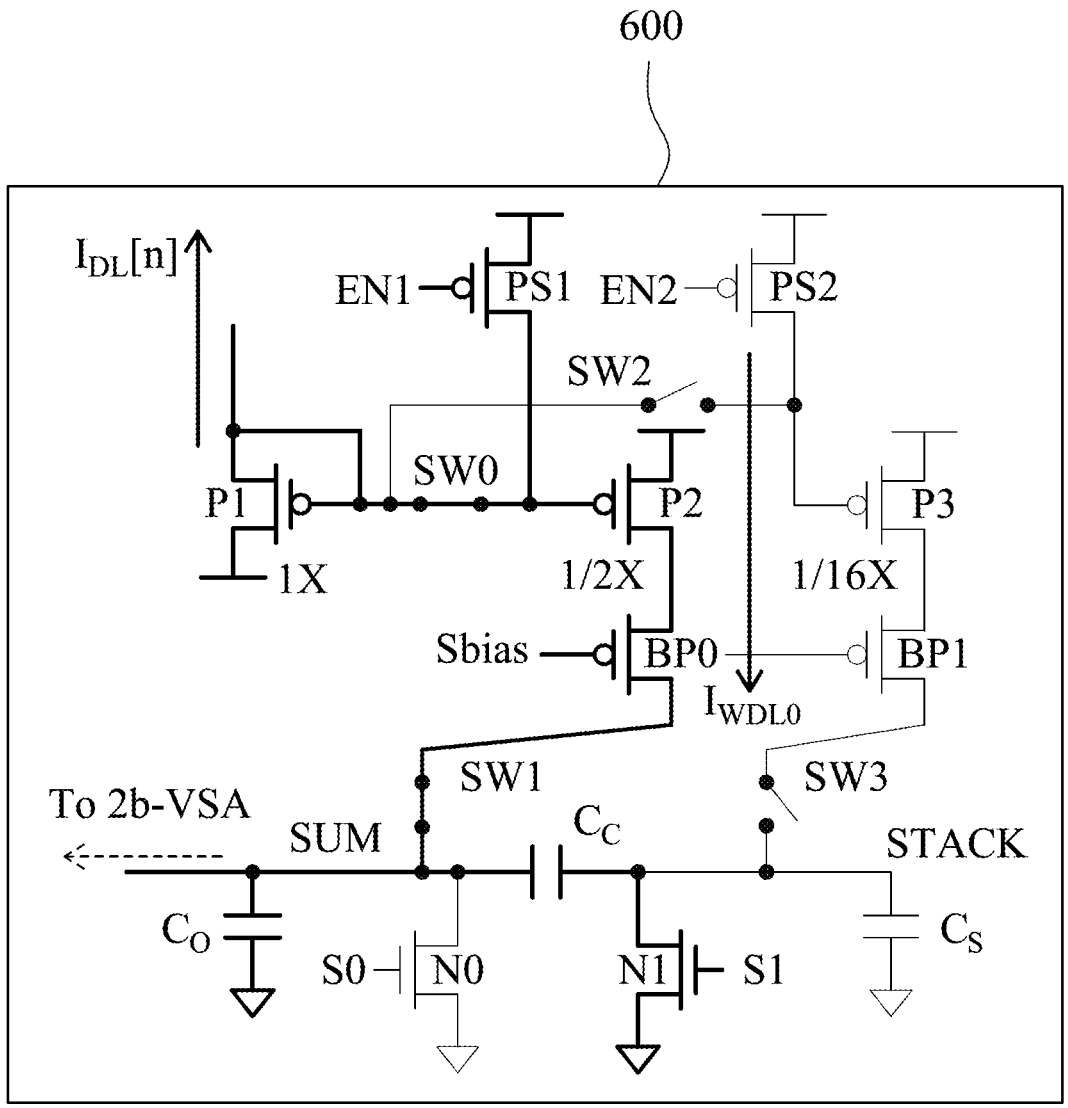
FIG. 6 shows a circuit diagram of each of a first converting operation and a second converting operation of the CVSS converter of the memory unit during each of a first input phase and a second input phase of FIG. 4.

FIG. 6 shows a circuit diagram of each of a first converting operation and a second converting operation of the CVSS converter 600 of the memory unit 100 during each of a first input phase WLP2 and a second input phase WLP1 of FIG. 4. In FIGS. 4 and 6, the dataline current $I_{DL}[n]$ flows through the first dataline transistor P1. The first sub-converter 610 is turned on by setting the first switching signal SWS0 and the second switching signal SWS1 to 1. The second sub-converter 620 is turned off by setting the third switching signal SWS2 and the fourth switching signal SWS3 to 0. The first stacking transistor N0 is turned off by setting the first stacking signal S0 to 0, and the second stacking transistor N1 is turned on by setting the second stacking signal S1 to 1. The output voltage $V_{SUM}$ rises to a first sum voltage $V_{SUM\text{-}P2}$ during the first input phase WLP2. The output voltage $V_{SUM}$ rises to a second sum voltage $V_{SUM\text{-}P1}$ during the second input phase WLP1.

Figure 7:
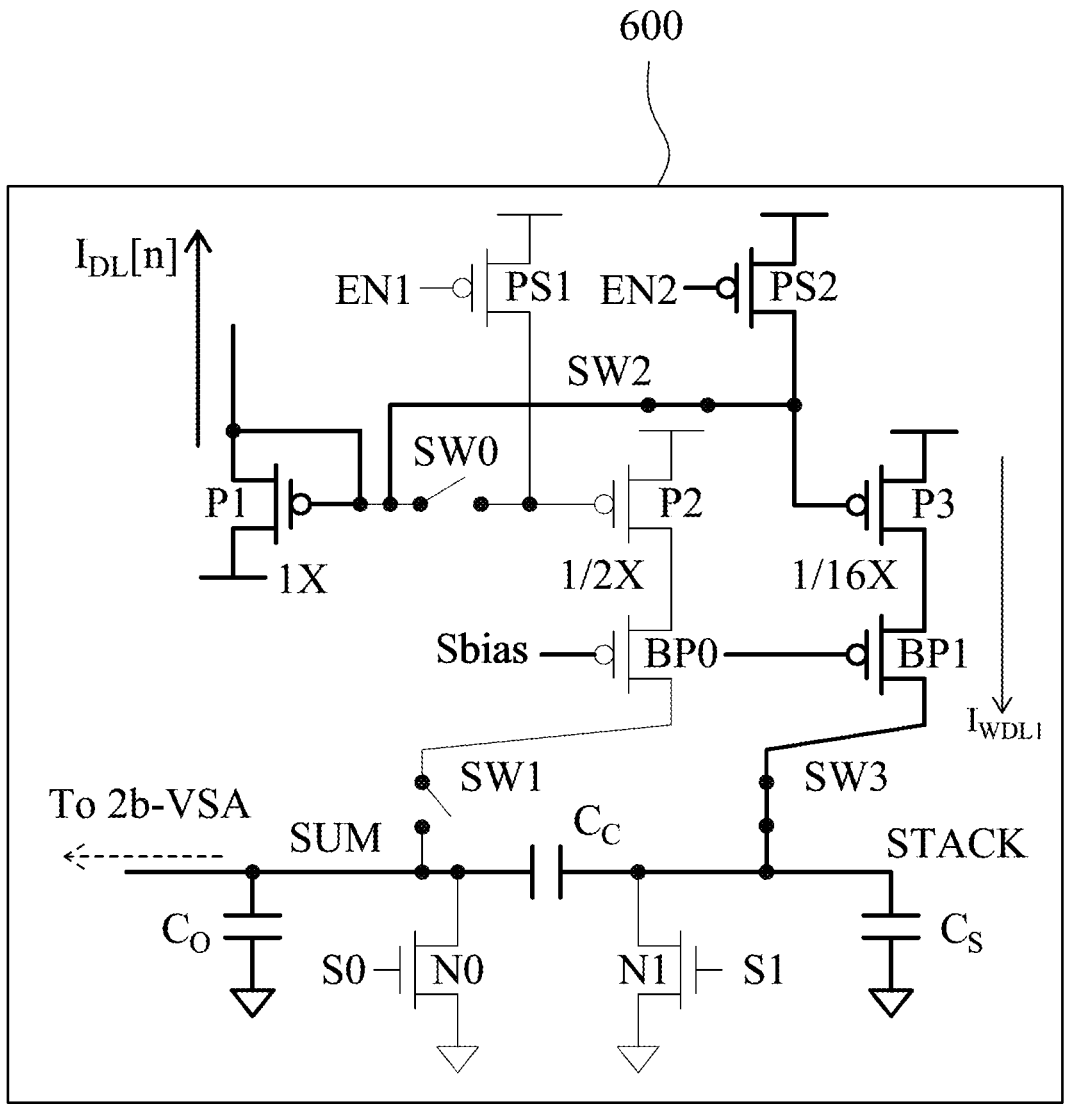
FIG. 7 shows a circuit diagram of a third converting operation of the CVSS converter of the memory unit during a third input phase of FIG. 4.

FIG. 7 shows a circuit diagram of a third converting operation of the CVSS converter 600 of the memory unit 100 during a third input phase WLP0 of FIG. 4. In FIGS. 4 and 7, the dataline current $I_{DL}[n]$ flows through the first dataline transistor P1. The first sub-converter 610 is turned off by setting the first switching signal SWS0 and the second switching signal SWS1 to 0, and the second sub-converter 620 is turned on by setting the third switching signal SWS2 and the fourth switching signal SWS3 to 1. The first stacking transistor N0 and the second stacking transistor N1 are turned off by setting the first stacking signal S0 and the second stacking signal S1 to 0. The output voltage $V_{SUM}$ rises to a third sum voltage $V_{SUM\text{-}P0}$ during the third input phase WLP0. The third sum voltage $V_{SUM\text{-}P0}$ is greater than the second sum voltage $V_{SUM\text{-}P1}$ and is equal to the second sum voltage $V_{SUM\text{-}P1}$ plus a stacking voltage $V_{STACK}$ because of the CVSS scheme.

Figure 8:
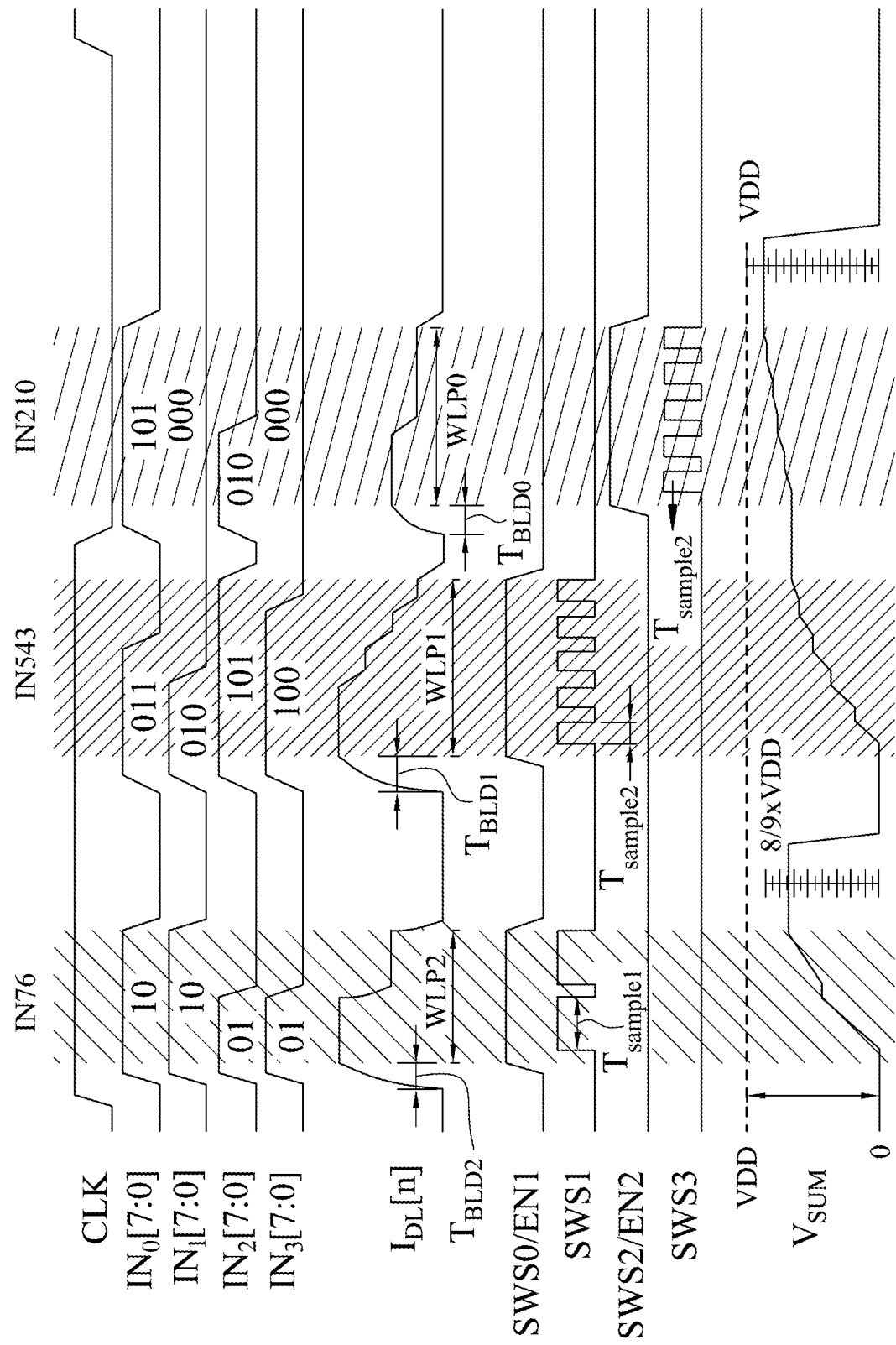
FIG. 8 shows timing diagrams of voltage levels of a plurality of 8-bit input signals, a plurality of switching signals and an output voltage and a current level of a dataline current, in accordance with another example of the 8-bit input signals of the present disclosure.

FIG. 8 shows timing diagrams of voltage levels of a plurality of 8-bit input signals $IN_0[7:0]$-$IN_3[7:0]$, a plurality of switching signals (e.g., SWS0-SWS3, EN1, EN2, S0, S1) and an output voltage $V_{SUM}$ and a current level of a dataline current $I_{DL}[n]$, in accordance with another example of the 8-bit input signals $IN_0[7:0]$-$IN_3[7:0]$ of the present disclosure. In FIG. 8, the 8-bit input signals $IN_0[7:0]$-$IN_3[7:0]$ are "10011101", "10010000", "01101010", "01100000", respectively. In the 8-bit input signal $IN_0[7:0]$, the first input sub-group IN76, the second input sub-group IN543 and the third input sub-group IN210 are "10", "011" and "101", respectively. In the 8-bit input signal $IN_1[7:0]$, the first input sub-group IN76, the second input sub-group IN543 and the third input sub-group IN210 are "10", "010" and "000", respectively. In the 8-bit input signal $IN_2[7:0]$, the first input sub-group IN76, the second input sub-group IN543 and the third input sub-group IN210 are "01", "101" and "010", respectively. In the 8-bit input signal $IN_3[7:0]$, the first input sub-group IN76, the second input sub-group IN543 and the third input sub-group IN210 are "01", "100" and "000", respectively. The input sub-groups IN76, IN543, IN210 are sequentially inputted to the word lines WL[0]-WL[3]. It is assumed that the resistive element of each of the non-volatile memory cells 210 is in LRS. The memory cell currents $I_{MC[0]}$, $I_{MC[1]}$, $I_{MC[2]}$, $I_{MC[3]}$ may be generated according to a state of the resistive element of each of the non-volatile memory cells 210 and the multi-bit input signals $IN_0[7:0]$-$IN_3[7:0]$, as shown in FIG. 3. The dataline current $I_{DL}[n]$ corresponding to the bit-line current $I_{BL}$ may be generated according to the memory cell currents $I_{MC[0]}$, $I_{MC[1]}$, $I_{MC[2]}$, $I_{MC[3]}$. During the first input phase WLP2, there are two computing sub-time intervals having two sampling time intervals $T_{sample1}$ for sampling according to the first input sub-group IN76 of each of the multi-bit input signals $IN_0[7:0]$-$IN_3[7:0]$. During the second input phase WLP1, there are five computing sub-time intervals having five sampling time intervals $T_{sample2}$ for sampling according to the second input sub-group IN543 of each of the multi-bit input signals $IN_0[7:0]$-$IN_3[7:0]$. During the third input phase WLP0, there are five computing sub-time intervals having five sampling time intervals $T_{sample2}$ for sampling according to the second input sub-group IN210 of each of the multi-bit input signals $IN_0[7:0]$-$IN_3[7:0]$.

Figure 9:
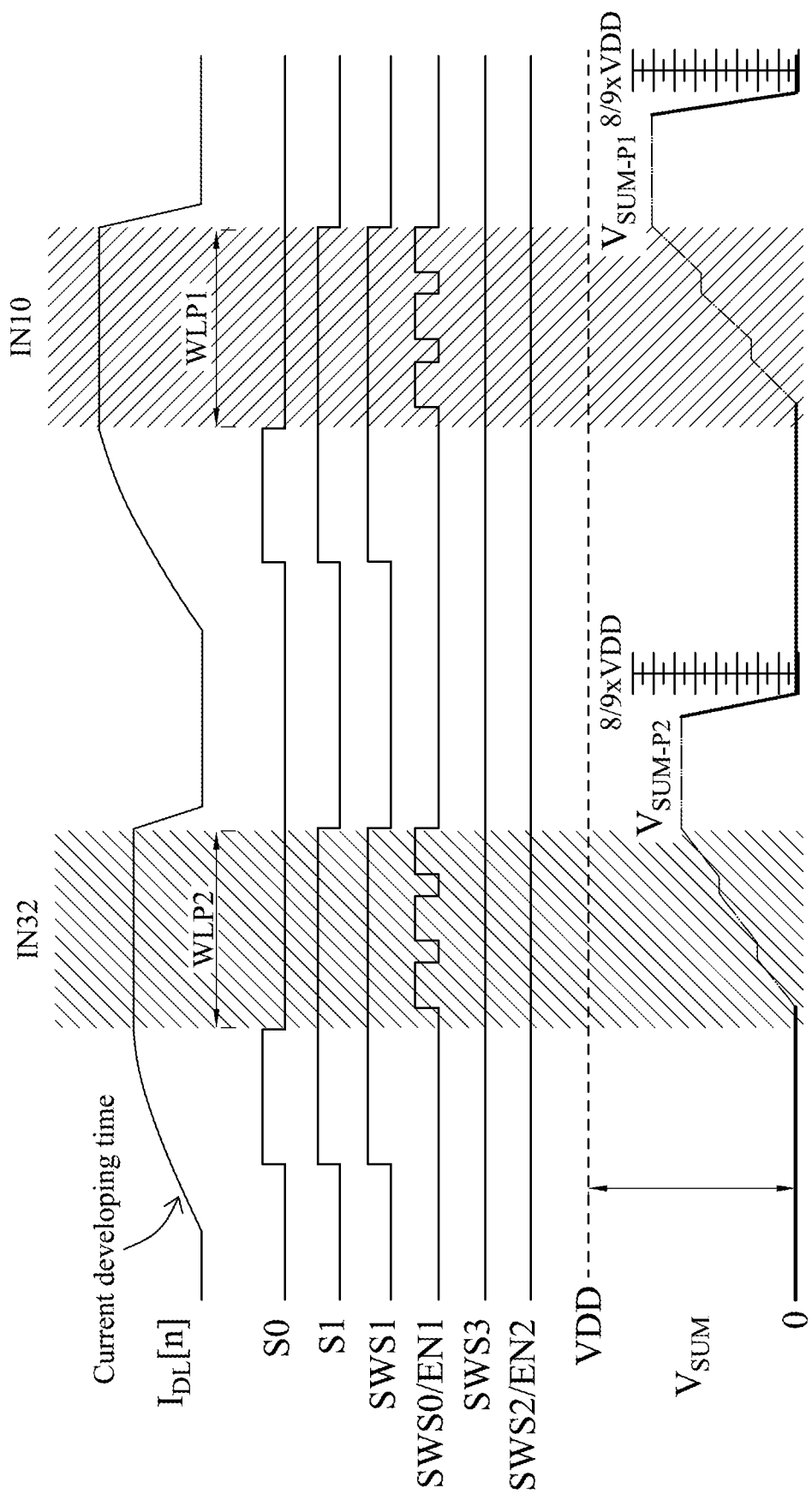
FIG. 9 shows timing diagrams of a current level of a dataline current and voltage levels of a plurality of switching signals and an output voltage, in accordance with an example of a plurality of 4-bit input signals of the present disclosure.

FIG. 9 shows timing diagrams of a current level of a dataline current $I_{DL}[n]$ and voltage levels of a plurality of switching signals (e.g., SWS0-SWS3, EN1, EN2, S0, S1) and an output voltage $V_{SUM}$, in accordance with an example of a plurality of 4-bit input signals of the present disclosure. In FIGS. 6 and 9, the first sub-converter 610 of the CVSS converter 600 is performed with the 4-bit input signals without the second sub-converter 620. The output voltage $V_{SUM}$ rises to the first sum voltage $V_{SUM-P2}$ during the first input phase WLP2. The output voltage $V_{SUM}$ rises to the second sum voltage $V_{SUM-P1}$ during the second input phase WLP1. During the first input phase WLP2, there are three computing sub-time intervals having three sampling time intervals for sampling according to the first input sub-group IN32 of each of the 4-bit input signals. During the second input phase WLP1, there are three computing sub-time intervals having three sampling time intervals for sampling according to the second input sub-group IN10 of each of the 4-bit input signals.

Figure 10:
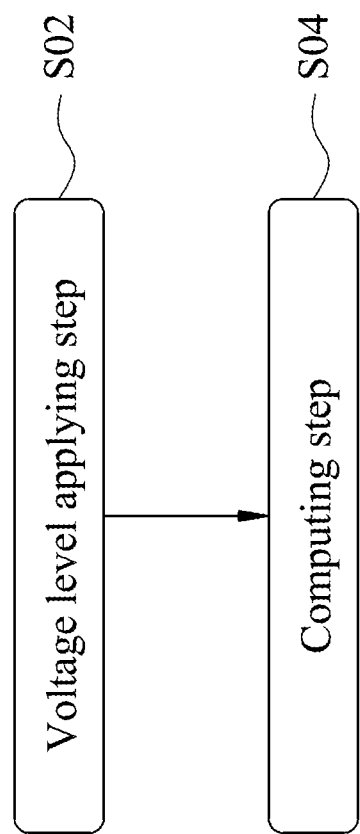
FIG. 10 shows a flow chart of a computing method of a memory unit with an AGMI scheme and a CVSS scheme for a plurality of nvCIM applications according to another embodiment of the present disclosure.

FIG. 10 shows a flow chart of a computing method 700 of a memory unit 100 with an AGMI scheme and a CVSS scheme for a plurality of nvCIM applications according to another embodiment of the present disclosure. In FIGS. 1, 3 and 10, the computing method 700 includes performing a voltage level applying step S02 and a computing step S04. The voltage level applying step S02 includes applying a plurality of voltage levels to the multi-bit input signals (e.g., $IN_0[7:0]$-$IN_3[7:0]$) and the switching signals (e.g., SWS0-SWS3, EN1, EN2, S0, S1). The computing step S04 includes driving the controller 400 to split the multi-bit input signals $IN_0[7:0]$-$IN_3[7:0]$ into the input sub-groups IN76, IN543, IN210, driving the controller 400 to sequentially input the input sub-groups IN76, IN543, IN210 to the word lines WL[0]-WL[3], driving the CVSS converter 600 to convert the bit-line current $I_{BL}$ into a plurality of converted voltages according to the input sub-groups IN76, IN543, IN210 and the switching signals (e.g., SWS0-SWS3, EN1, EN2, S0, S1), and driving the CVSS converter 600 to stack the converted voltages to form an output voltage $V_{SUM}$. The output voltage $V_{SUM}$ is corresponding to a sum of a plurality of multiplication values which are equal to the multi-bit input signals $IN_0[7:0]$-$IN_3[7:0]$ multiplied by the weights $W_0[0]$-$W_3[0]$.

In the voltage level applying step S02, the switching signals include a first switching signal SWS0, a second switching signal SWS1, a third switching signal SWS2, a fourth switching signal SWS3, a first enable signal EN1, a second enable signal EN2, a bias signal Sbias, a first stacking signal S0 and a second stacking signal S1. The first switching signal SWS0 is applied to the first two-terminal switching element SW0 to switch the first two-terminal switching element SW0. The second switching signal SWS1 is applied to the second two-terminal switching element SW1 to switch the second two-terminal switching element SW1. The third switching signal SWS2 is applied to the third two-terminal switching element SW2 to switch the third two-terminal switching element SW2. The fourth switching signal SWS3 is applied to the fourth two-terminal switching element SW3 to switch the fourth two-terminal switching element SW3. The first enable signal EN1 is applied to the first switching transistor PS1 to switch the first switching transistor PS1. The second enable signal EN2 is applied to the second switching transistor PS2 to switch the second switching transistor PS2. The bias signal Sbias is applied to the first bias transistor BP0 and the second bias transistor BP1 to control the first bias transistor BP0 and the second bias transistor BP1. The first stacking signal S0 is applied to the first stacking transistor N0 to control the first stacking transistor N0. The second stacking signal S1 is applied to the second stacking transistor N1 to control the second stacking transistor N1. The first switching signal SWS0 is equal to the first enable signal EN1. The third switching signal SWS2 is equal to the second enable signal EN2. The switching signals (e.g., SWS0-SWS3, EN1, EN2, S0, S1) are applied by the controller 400.

In the computing step S04, the AGMI scheme and the CVSS scheme are performed to generate the output voltage $V_{SUM}$ by the non-volatile memory array 200, the word line driver 300, the controller 400, the column multiplexer 500 and the CVSS converter 600. In detail, the non-volatile memory array 200 is driven to generate the memory cell currents $I_{MC[0]}$, $I_{MC[1]}$, $I_{MC[2]}$, $I_{MC[3]}$ according to the multi-bit input signals $IN_0[7:0]$-$IN_3[7:0]$ and the weights $W_0[0]$-$W_3[0]$. The non-volatile memory array 200 generates a bit-line current $I_{BL}$ according to the memory cell currents $I_{MC[0]}$, $I_{MC[1]}$, $I_{MC[2]}$, $I_{MC[3]}$. The word line driver 300 is driven to generate the voltage levels of the multi-bit input signals $IN_0[7:0]$-$IN_3[7:0]$ and transmit the multi-bit input signals $IN_0[7:0]$-$IN_3[7:0]$ to the non-volatile memory array 200 via the word lines WL[0]-WL[3]. The controller 400 is driven to split the multi-bit input signals $IN_0[7:0]$-$IN_3[7:0]$ into the input sub-groups IN76, IN543, IN210 and sequentially input the input sub-groups IN76, IN543, IN210 to the word lines WL[0]-WL[3]. The column multiplexer 500 is driven to generate a dataline current $I_{DL}[n]$ according to the bit-line current $I_{BL}$. The CVSS converter 600 is driven to convert the bit-line current $I_{BL}$ into the converted voltages according to the input sub-groups IN76, IN543, IN210 and the switching signals (e.g., SWS0-SWS3, EN1, EN2, S0, S1) and stack the converted voltages to form the output voltage $V_{SUM}$.

Figure 11:
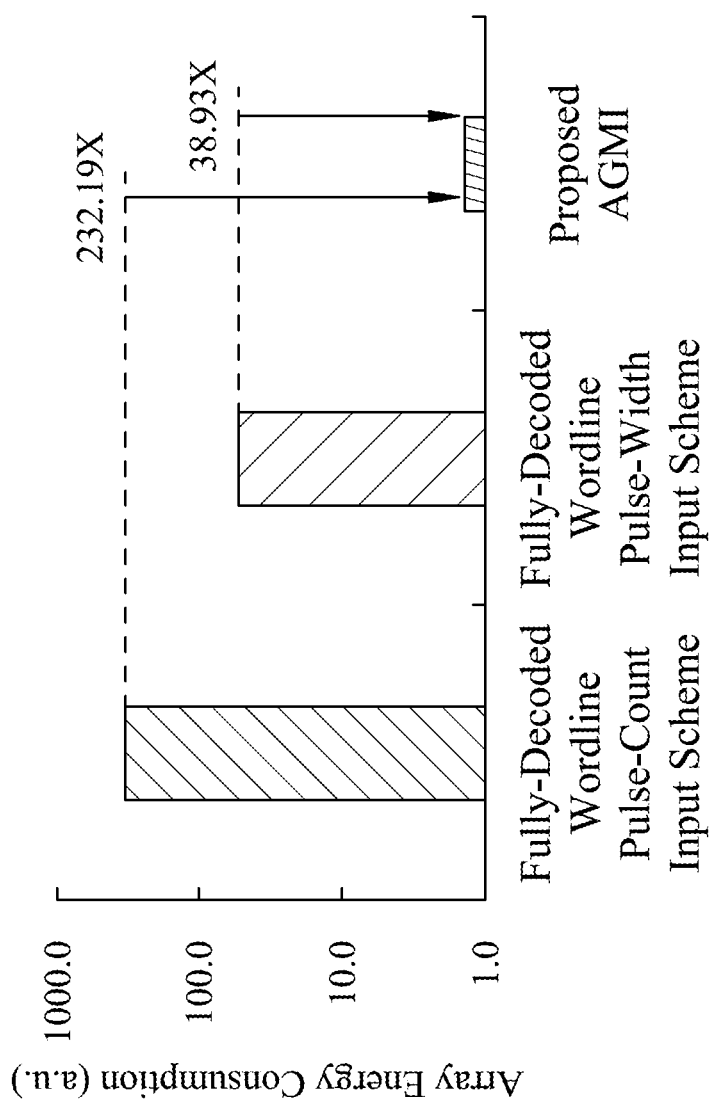
FIG. 11 shows a comparison result of array energy consumption among the memory unit with the AGMI scheme of the present disclosure, a memory unit with a conventional fully-decoded wordline pulse-count input scheme and a memory unit with a conventional fully-decoded wordline pulse-width input scheme.
Figure 12:
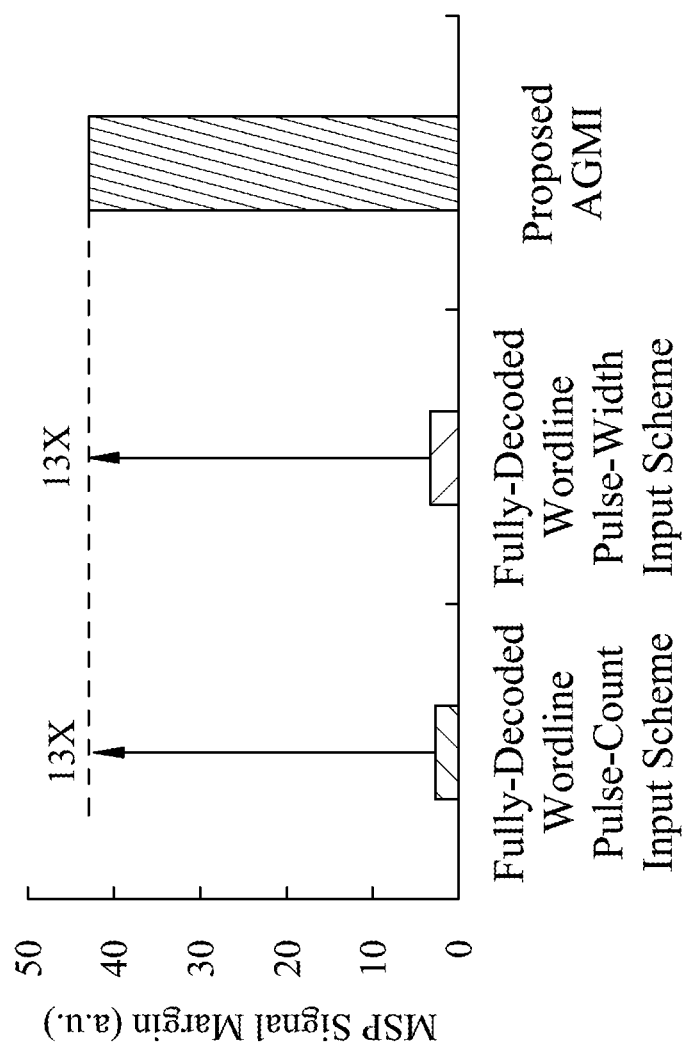
FIG. 12 shows a comparison result of most significant bit part (MSP) signal margin among the memory unit with the AGMI scheme of the present disclosure, the memory unit with the conventional fully-decoded wordline pulse-count input scheme and the memory unit with the conventional fully-decoded wordline pulse-width input scheme.

FIG. 11 shows a comparison result of array energy consumption among the memory unit 100 with the AGMI scheme of the present disclosure, a memory unit with a conventional fully-decoded wordline pulse-count input scheme and a memory unit with a conventional fully-decoded wordline pulse-width input scheme. FIG. 12 shows a comparison result of most significant bit part (MSP) signal margin among the memory unit 100 with the AGMI scheme of the present disclosure, the memory unit with the conventional fully-decoded wordline pulse-count input scheme and the memory unit with the conventional fully-decoded wordline pulse-width input scheme. In FIGS. 11 and 12, the 8-bit input signals and 8-bit weights are used to generate the comparison results of array energy consumption and MSP signal margin. The memory unit with the conventional fully-decoded wordline pulse-count input scheme and the memory unit with the conventional fully-decoded wordline pulse-width input scheme suffer long latency due to a lower number of parallel inputs that need multiple cycles for applying inputs to nvCIM and corresponding computing operations. The AGMI scheme of the present disclosure can drastically decrease the energy consumption of the cell array (i.e., array energy consumption) by 38.93X-232.19X and achieve 13X larger signal margin of MSP compared to the conventional input schemes, respectively.

Figure 13:
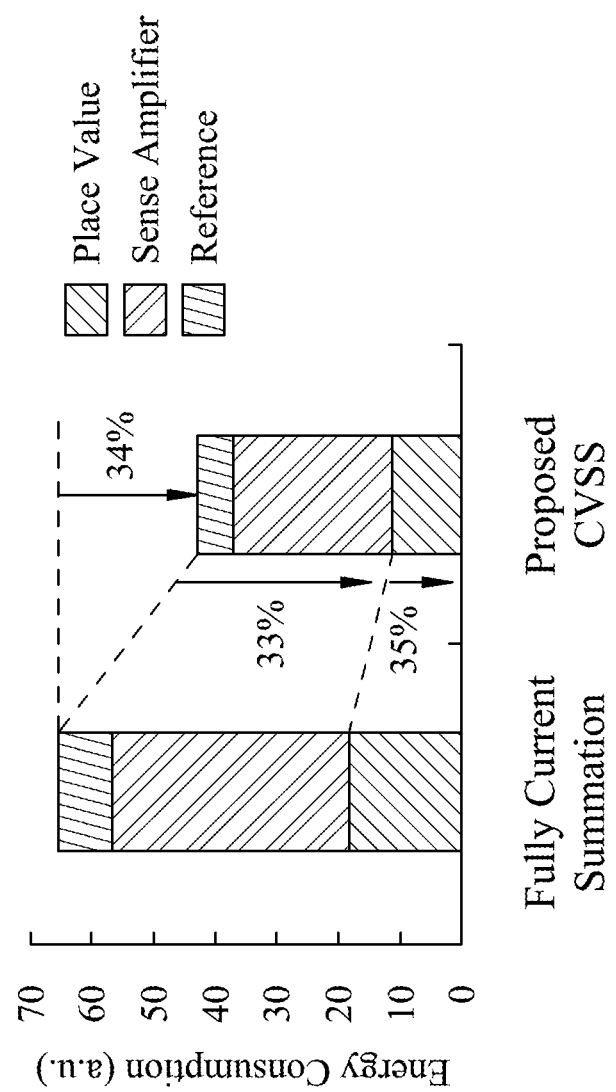
FIG. 13 shows a comparison result of energy consumption between the memory unit with the CVSS scheme of the present disclosure and a memory unit with a conventional fully current summation scheme.

FIG. 13 shows a comparison result of energy consumption between the memory unit 100 with the CVSS scheme of the present disclosure and a memory unit with a conventional fully current summation scheme. In FIG. 13, the 4-bit input signals and 4-bit weights are used to generate the comparison result of energy consumption. The energy consumption composed of the sense amplifier and the reference generator can be decreased by 33% with the CVSS scheme of the present disclosure compared to the conventional fully current summation scheme. The energy consumption composed of place value computing can be decreased by 35% with the CVSS scheme of the present disclosure compared to the conventional fully current summation scheme. The energy consumption composed of place value computing, the sense amplifier and the reference generator can be decreased by 34% with the CVSS scheme of the present disclosure compared to the conventional fully current summation scheme.

According to the aforementioned embodiments and examples, the advantages of the present disclosure are described as follows.

1. The memory unit with the AGMI scheme and the CVSS scheme for the nvCIM applications and the computing method thereof of the present disclosure can be applied to nvCIM macro for high precision of MAC computing with short latency, high energy efficiency, and robust MAC readout operation. The waveform shows the MAC operation of four 8-bit input signals which are applied serially in three input phases with four word lines activated simultaneously. The output voltages in different phases are accumulated and stacked by the CVSS converter.

2. The memory unit with the AGMI scheme and the CVSS scheme for the nvCIM applications of the present disclosure not only utilizes the AGMI scheme to reduce the computing latency, decrease the array energy consumption and achieve larger signal margin of MSP, but also utilizes the CVSS scheme to decrease the energy consumption of place value computing, the sense amplifier and the reference generator.

3. The AGMI scheme of the present disclosure can drastically decrease the energy consumption of the cell array by 38.93X-232.19X and achieve 13X larger signal margin of MSP compared to the conventional input schemes, respectively.

4. The energy consumption composed of place value computing, the sense amplifier and the reference generator can be decreased by 34% with the CVSS scheme of the present disclosure compared to the conventional fully current summation scheme.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with an asymmetric group-modulated input scheme and a current-to-voltage signal stacking scheme for a plurality of non-volatile computing-in-memory applications, which is configured to compute a plurality of multi-bit input signals and a plurality of weights, and the memory unit with the asymmetric group-modulated input scheme and the current-to-voltage signal stacking scheme for the plurality of non-volatile computing-in-memory applications comprising:
   a plurality of non-volatile memory cells controlled by a plurality of word lines to generate a plurality of memory cell currents and storing the weights, wherein the word lines transmit the multi-bit input signals, respectively;
   a source line electrically connected to one end of each of the non-volatile memory cells;
   a bit line electrically connected to another end of each of the non-volatile memory cells and having a bit-line current, wherein the bit-line current is equal to a sum of the memory cell currents;
   a controller electrically connected to the non-volatile memory cells, wherein the controller splits the multi-bit input signals into a plurality of input sub-groups and generates a plurality of switching signals according to the input sub-groups, and the input sub-groups are sequentially inputted to the word lines; and
   a current-to-voltage signal stacking converter electrically connected to the non-volatile memory cells via the bit line, wherein the current-to-voltage signal stacking converter is electrically connected to the controller and converts the bit-line current into a plurality of converted voltages according to the input sub-groups and the switching signals, and the current-to-voltage signal stacking converter stacks the converted voltages to form an output voltage, and the output voltage is corresponding to a sum of a plurality of multiplication values which are equal to the multi-bit input signals multiplied by the weights;
   wherein each of the multi-bit input signals has eight bits, the input sub-groups comprise a first input sub-group, a second input sub-group and a third input sub-group, and the first input sub-group, the second input sub-group and the third input sub-group have two bits, three bits and three bits, respectively.

2. The memory unit with the asymmetric group-modulated input scheme and the current-to-voltage signal stacking scheme for the plurality of non-volatile computing-in-memory applications of claim 1, further comprising:
a column multiplexer electrically connected between each of the non-volatile memory cells and the current-to-voltage signal stacking converter, wherein the column multiplexer receives the bit-line current and generates a dataline current according to the bit-line current;
wherein the current-to-voltage signal stacking converter receives the dataline current from the column multiplexer and converts the dataline current into the converted voltages according to the input sub-groups and the switching signals.

3. The memory unit with the asymmetric group-modulated input scheme and the current-to-voltage signal stacking scheme for the plurality of non-volatile computing-in-memory applications of claim 2, wherein the current-to-voltage signal stacking converter comprises:
a first dataline transistor electrically connected to the column multiplexer, wherein the dataline current flows through the first dataline transistor;
a first sub-converter electrically connected to the first dataline transistor;
a coupling capacitor, wherein one end of the coupling capacitor is electrically connected to the first sub-converter;
an output capacitor electrically connected between the one end of the coupling capacitor and a ground voltage;
a stacking capacitor electrically connected between another end of the coupling capacitor and the ground voltage;
a first stacking transistor electrically connected between the one end of the coupling capacitor and the ground voltage; and
a second stacking transistor electrically connected between the another end of the coupling capacitor and the ground voltage.

4. The memory unit with the asymmetric group-modulated input scheme and the current-to-voltage signal stacking scheme for the plurality of non-volatile computing-in-memory applications of claim 3, wherein the first sub-converter comprises:
a first two-terminal switching element electrically connected to the first dataline transistor;
a first switching transistor electrically connected between the first two-terminal switching element and a power supply voltage;
a second dataline transistor electrically connected to the first two-terminal switching element and the first switching transistor;
a first bias transistor electrically connected to the second dataline transistor; and
a second two-terminal switching element electrically connected to the first bias transistor, the coupling capacitor, the output capacitor and the first stacking transistor.

5. The memory unit with the asymmetric group-modulated input scheme and the current-to-voltage signal stacking scheme for the plurality of non-volatile computing-in-memory applications of claim 4, wherein the first dataline transistor has a first transistor width, the second dataline transistor has a second transistor width, and the second transistor width is equal to one-half of the first transistor width.

6. The memory unit with the asymmetric group-modulated input scheme and the current-to-voltage signal stacking scheme for the plurality of non-volatile computing-in-memory applications of claim 3, wherein the current-to-voltage signal stacking converter further comprises:
a second sub-converter electrically connected between the first dataline transistor and the another end of the coupling capacitor;
wherein the first sub-converter and the second sub-converter are operated at different time periods.

7. The memory unit with the asymmetric group-modulated input scheme and the current-to-voltage signal stacking scheme for the plurality of non-volatile computing-in-memory applications of claim 6, wherein the second sub-converter comprises:
a third two-terminal switching element electrically connected to the first dataline transistor;
a second switching transistor electrically connected between the third two-terminal switching element and a power supply voltage;
a third dataline transistor electrically connected to the third two-terminal switching element and the second switching transistor;
a second bias transistor electrically connected to the third dataline transistor; and
a fourth two-terminal switching element electrically connected to the second bias transistor, the coupling capacitor, the stacking capacitor and the second stacking transistor.

8. The memory unit with the asymmetric group-modulated input scheme and the current-to-voltage signal stacking scheme for the plurality of non-volatile computing-in-memory applications of claim 7, wherein the first dataline transistor has a first transistor width, the third dataline transistor has a third transistor width, and the third transistor width is equal to one-sixteenth of the first transistor width.

9. A computing method of a memory unit with an asymmetric group-modulated input scheme and a current-to-voltage signal stacking scheme for a plurality of non-volatile computing-in-memory applications, which is configured to compute a plurality of multi-bit input signals and a plurality of weights, the computing method comprising:
performing a voltage level applying step, wherein the voltage level applying step comprises applying a plurality of voltage levels to the multi-bit input signals and a plurality of switching signals; and
performing a computing step, wherein the computing step comprises:
driving a controller to split the multi-bit input signals into a plurality of input sub-groups;
driving the controller to sequentially input the input sub-groups to a plurality of word lines;
driving a current-to-voltage signal stacking converter to convert a bit-line current into a plurality of converted voltages according to the input sub-groups and the switching signals; and
driving the current-to-voltage signal stacking converter to stack the converted voltages to form an output voltage;
wherein the output voltage is corresponding to a sum of a plurality of multiplication values which are equal to the multi-bit input signals multiplied by the weights;
wherein the memory unit with the asymmetric group-modulated input scheme and the current-to-voltage signal stacking scheme for the plurality of non-volatile computing-in-memory applications comprises:
a plurality of non-volatile memory cells controlled by the word lines to generate a plurality of memory cell currents and storing the weights, wherein the word lines transmit the multi-bit input signals, respectively;
a source line electrically connected to one end of each of the non-volatile memory cells;
a bit line electrically connected to another end of each of the non-volatile memory cells and having the bit-line current, wherein the bit-line current is equal to a sum of the memory cell currents;
the controller electrically connected to the non-volatile memory cells, wherein the controller splits the multi-bit input signals into the input sub-groups and generates the switching signals according to the input sub-groups, and the input sub-groups are sequentially inputted to the word lines; and
the current-to-voltage signal stacking converter electrically connected to the non-volatile memory cells via the bit line, wherein the current-to-voltage signal stacking converter is electrically connected to the controller and converts the bit-line current into the converted voltages according to the input sub-groups and the switching signals, and the current-to-voltage signal stacking converter stacks the converted voltages to form the output voltage.

10. The computing method of claim 9, wherein the memory unit with the asymmetric group-modulated input scheme and the current-to-voltage signal stacking scheme for the plurality of non-volatile computing-in-memory applications further comprising:
a column multiplexer electrically connected between each of the non-volatile memory cells and the current-to-voltage signal stacking converter, wherein the column multiplexer receives the bit-line current and generates a dataline current according to the bit-line current;
wherein the current-to-voltage signal stacking converter receives the dataline current and converts the dataline current into the converted voltages according to the input sub-groups and the switching signals.

11. The computing method of claim 10, wherein the current-to-voltage signal stacking converter comprises:
a first dataline transistor electrically connected to the column multiplexer, wherein the dataline current flows through the first dataline transistor;
a first sub-converter electrically connected to the first dataline transistor;
a coupling capacitor, wherein one end of the coupling capacitor is electrically connected to the first sub-converter;
an output capacitor electrically connected between the one end of the coupling capacitor and a ground voltage;
a stacking capacitor electrically connected between another end of the coupling capacitor and the ground voltage;
a first stacking transistor electrically connected between the one end of the coupling capacitor and the ground voltage; and
a second stacking transistor electrically connected between the another end of the coupling capacitor and the ground voltage.

12. The computing method of claim 11, wherein the first sub-converter comprises:
a first two-terminal switching element electrically connected to the first dataline transistor;
a first switching transistor electrically connected between the first two-terminal switching element and a power supply voltage;
a second dataline transistor electrically connected to the first two-terminal switching element and the first switching transistor;
a first bias transistor electrically connected to the second dataline transistor; and
a second two-terminal switching element electrically connected to the first bias transistor, the coupling capacitor, the output capacitor and the first stacking transistor.

13. The computing method of claim 12, wherein in the voltage level applying step, the switching signals comprise:
a first switching signal applied to the first two-terminal switching element to switch the first two-terminal switching element;
a second switching signal applied to the second two-terminal switching element to switch the second two-terminal switching element;
a first enable signal applied to the first switching transistor to switch the first switching transistor;
a bias signal applied to the first bias transistor to control the first bias transistor;
a first stacking signal applied to the first stacking transistor to control the first stacking transistor; and
a second stacking signal applied to the second stacking transistor to control the second stacking transistor.

14. The computing method of claim 12, wherein the first dataline transistor has a first transistor width, the second dataline transistor has a second transistor width, and the second transistor width is equal to one-half of the first transistor width.

15. The computing method of claim 11, wherein the current-to-voltage signal stacking converter further comprises:
a second sub-converter electrically connected between the first dataline transistor and the another end of the coupling capacitor;
wherein the first sub-converter and the second sub-converter are operated at different time periods.

16. The computing method of claim 15, wherein the second sub-converter comprises:
a third two-terminal switching element electrically connected to the first dataline transistor;
a second switching transistor electrically connected between the third two-terminal switching element and a power supply voltage;
a third dataline transistor electrically connected to the third two-terminal switching element and the second switching transistor;
a second bias transistor electrically connected to the third dataline transistor; and
a fourth two-terminal switching element electrically connected to the second bias transistor, the coupling capacitor, the stacking capacitor and the second stacking transistor.

17. The computing method of claim 16, wherein in the voltage level applying step, the switching signals comprise:
a third switching signal applied to the third two-terminal switching element to switch the third two-terminal switching element;
a fourth switching signal applied to the fourth two-terminal switching element to switch the fourth two-terminal switching element;
a second enable signal applied to the second switching transistor to switch the second switching transistor;
a bias signal applied to the second bias transistor to control the second bias transistor;
a first stacking signal applied to the first stacking transistor to control the first stacking transistor; and a second stacking signal applied to the second stacking transistor to control the second stacking transistor.

18. The computing method of claim 16, wherein the first dataline transistor has a first transistor width, the third dataline transistor has a third transistor width, and the third transistor width is equal to one-sixteenth of the first transistor width.

19. The computing method of claim 9, wherein each of the multi-bit input signals has eight bits, the input sub-groups comprise a first input sub-group, a second input sub-group and a third input sub-group, and the first input sub-group, the second input sub-group and the third input sub-group have two bits, three bits and three bits, respectively.

* * * * *